United States Patent
Lee et al.

(10) Patent No.: US 6,791,484 B1
(45) Date of Patent: Sep. 14, 2004

(54) METHOD AND APPARATUS OF SYSTEM OFFSET CALIBRATION WITH OVERRANGING ADC

(75) Inventors: Bumha Lee, Sunnyvale, CA (US); Brian D. Segerstedt, Redwood City, CA (US); Christina P. Phan, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/623,149

(22) Filed: Jul. 18, 2003

(51) Int. Cl.[7] ............................................. H03M 1/06
(52) U.S. Cl. ..................... 341/118; 341/120; 341/110
(58) Field of Search ........................... 341/144, 145, 341/155, 156, 150, 110, 118, 120

(56) References Cited

U.S. PATENT DOCUMENTS

| | | | |
|---|---|---|---|
| 6,232,897 B1 * | 5/2001 | Knusen ..................... | 341/120 |
| 6,422,745 B1 * | 7/2002 | Glasheen et al. ............ | 374/131 |
| 6,671,001 B2 * | 12/2003 | Lin .............................. | 348/679 |

OTHER PUBLICATIONS

"Complete 12–Bit/10–Bit 6 MSPS CCD/CIS Signal Processors" AD9807/AD9805, pp. 1–24, 1997.
Lewis et al., "A 10–b 20–Msample/ s Analog–to–Digital Converter," IEEE Journal of Solid–State Circuits, vol. 27, pp. 351–358, Mar. 1992.

* cited by examiner

*Primary Examiner*—Brian Young
*Assistant Examiner*—John B Nguyen
(74) *Attorney, Agent, or Firm*—Darby & Darby PC; Matthew M. Gaffney

(57) ABSTRACT

A method and apparatus for system offset calibration using an overranging ADC is provided. The overranging ADC is configured to convert an analog signal into an intermediary digital signal. The conversion range of the overranging ADC is extended beyond the full dynamic range of the ADC system. The intermediary digital signal has more bits than the digital output signal. A digital fine offset adjustment circuit is configured to provide the digital output signal by digitally subtracting a fine offset from the intermediary digital signal and decoding the intermediary digital signal. The digital output signal has approximately no offset, and has approximately no loss in dynamic range.

19 Claims, 13 Drawing Sheets

Transfer Curve with Negative Offset

Transfer Curve with Positive Offset

| | VREF1 | VREF2 | VREF3 | VREF4 | VREF5 | VREF6 | VREF7 | VREF8 | $V_{OUT}$ | DOUT1 |
|---|---|---|---|---|---|---|---|---|---|---|
| 7/8 < VIN | 0.5 | 0.5 | 0.5 | 0.5 | -0.5 | -0.5 | -0.5 | -0.5 | $4V_{IN}-4$ | 1000 |
| 5/8 < VIN < 7/8 | 0.5 | 0.5 | 0.5 | 0 | 0 | -0.5 | -0.5 | -0.5 | $4V_{IN}-3$ | 0111 |
| 3/8 < VIN < 5/8 | 0.5 | 0.5 | 0 | 0 | 0 | 0 | -0.5 | -0.5 | $4V_{IN}-2$ | 0110 |
| 1/8 < VIN < 3/8 | 0.5 | 0 | 0 | 0 | 0 | 0 | 0 | -0.5 | $4V_{IN}-1$ | 0101 |
| -1/8 < VIN < 1/8 | 0 | 0 | 0 | 0 | 0 | 0 | 0 | 0 | $4V_{IN}$ | 0100 |
| -1/8 < VIN < -3/8 | -0.5 | 0 | 0 | 0 | 0 | 0 | 0.5 | 0.5 | $4V_{IN}+1$ | 0011 |
| -3/8 < VIN < -5/8 | -0.5 | -0.5 | 0 | 0 | 0 | 0.5 | 0.5 | 0.5 | $4V_{IN}+2$ | 0010 |
| -7/8 < VIN < -5/8 | -0.5 | -0.5 | -0.5 | 0 | 0.5 | 0.5 | 0.5 | 0.5 | $4V_{IN}+3$ | 0001 |
| VIN < -7/8 | -0.5 | -0.5 | -0.5 | -0.5 | 0.5 | 0.5 | 0.5 | 0.5 | $4V_{IN}+4$ | 0000 |

METHOD AND APPARATUS OF SYSTEM OFFSET CALIBRATION WITH OVERRANGING ADC

FIELD OF THE INVENTION

The present invention relates to analog-to-digital conversion, and, in particular, to a method and apparatus of system offset calibration using an overranging analog-to-digital converter.

BACKGROUND OF THE INVENTION

An analog-to-digital converter (ADC) system is configured to convert an analog input signal into a digital output signal. The ADC system comprises a programmable gain amplifier (PGA) and an analog-to-digital converter (ADC). The PGA is configured to adjust the amplitude of the analog input signal to match the input signal level to the full signal range of the ADC. An offset may be present in the input signal, while another offset may be caused by the PGA. These offsets may cause significant performance degradation in the ADC conversion process.

FIG. 1 is a graphic illustration of a system transfer curve for an ADC that includes a negative offset. The digital output code corresponds to zero when a voltage associated with the analog input signal is less than the magnitude of the negative offset. As a result, codes are lost for a "deadzone" portion of the transfer curve.

FIG. 2 is a graphic illustration of a system transfer curve for an ADC that includes a positive offset. The digital output signal is clamped at a digital code that corresponds to a maximum code when the sum of the voltage that is associated with analog input signal and the offset exceeds the maximum range of the ADC. The digital output signal is saturated at the maximum code before the full voltage range of the analog input signal can be utilized such that the dynamic range of the ADC circuit is reduced.

BRIEF DESCRIPTION OF THE DRAWINGS

Non-limiting and non-exhaustive embodiments of the present invention are described with reference to the following drawings.

FIG. 9 is a tabular illustration of values of reference voltages that are utilized by an example embodiment of an MDAC that is configured for operation in the ADC system of FIG. 3.

DETAILED DESCRIPTION OF THE PREFERRED EMBODIMENTS

Figure 1:
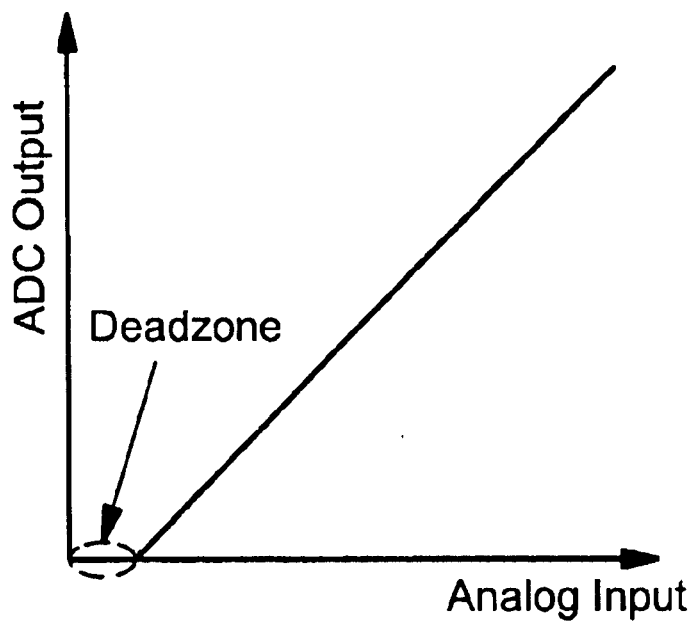
FIG. 1 is a graphic illustration of a system transfer curve for an ADC that includes a negative offset.
Figure 2:
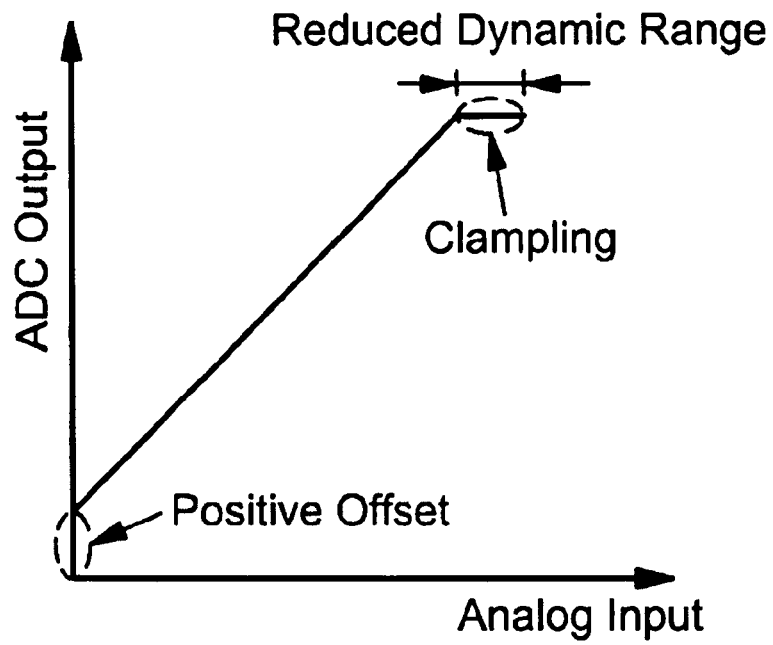
FIG. 2 is a graphic illustration of a system transfer curve for an ADC that includes a positive offset.

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal. Referring to the drawings, like numbers indicate like parts throughout the views.

Briefly stated, the invention is related to a method and apparatus for system offset calibration using an overranging ADC. The overranging ADC is configured to convert an analog signal into an intermediary digital signal. The conversion range of the overranging ADC is extended beyond the full dynamic range of the ADC system. The intermediary digital signal has more bits than the digital output signal. A digital fine offset adjustment circuit is configured to provide the digital output signal by digitally subtracting a fine offset from the intermediary digital signal and decoding the intermediary digital signal. The digital output signal has approximately no offset, and has approximately no loss in dynamic range.

System Overview

Figure 3:
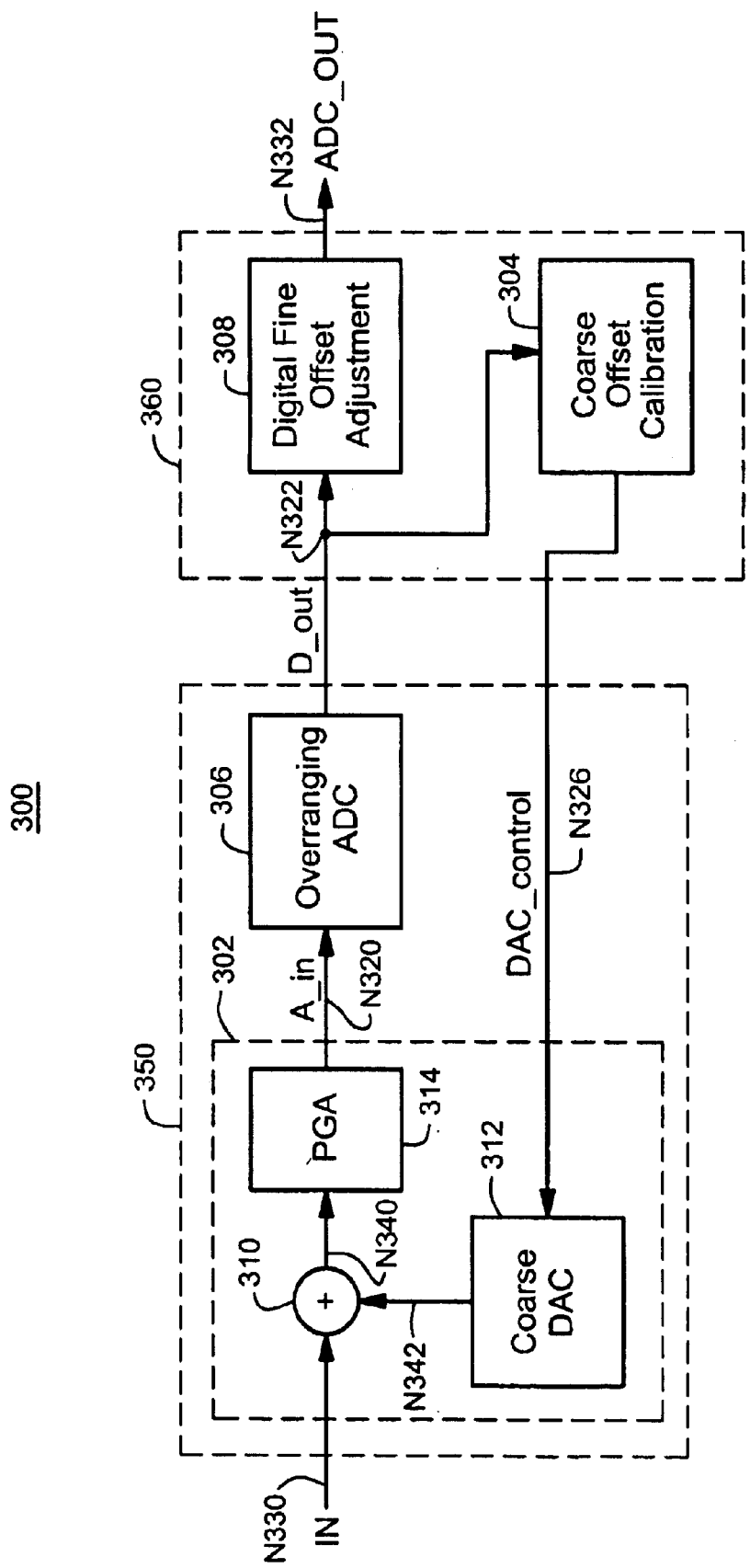
FIG. 3 is a schematic illustration of an example embodiment of an ADC system that is arranged in accordance with aspects of the present invention.

FIG. 3 is a schematic illustration of an example embodiment of an ADC system (300) that is arranged in accordance with aspects of the present invention. System 300 includes an analog signal processing block (350) and a digital control block (360). Analog signal processing block 350 includes coarse adjustment circuit 302 and overranging ADC circuit 306. Digital control block 360 includes coarse offset calibration circuit 304 and digital fine offset adjustment circuit 308. According to one example, coarse adjustment circuit 302 includes summer block 310, coarse DAC block 312, and programmable gain amplifier (PGA) block 314.

Overranging ADC circuit 306 has an input that is coupled to node N320 and an output that is coupled to node N322. Digital fine offset adjustment circuit 308 has an input that is coupled to node N322 and an output that is coupled to node N332. Coarse offset calibration circuit 304 has an input that is coupled to node N322 and an output that is coupled to node N326. Summer block 310 has a first input that is coupled to node N330, a second input that is coupled to node N342, and an output that is coupled to node N340. Coarse DAC block 312 has an input that is coupled to node N326 and an output that is coupled to node N342. PGA block 314 has an input that is coupled to node N340 and an output that is coupled to node N320.

Operation of Coarse Adjustment Circuit

In operation, an analog input signal (IN) is applied at node N330. Coarse adjustment circuit 302 is configured to provide coarse offset and gain adjustment on signal IN to provide an analog intermediary signal (A_in) at node N320. Coarse adjustment circuit 302 is arranged (e.g., via coarse DAC block 312) to roughly adjust the offset of signal IN such that an offset calibration range is maintained. Coarse adjustment circuit 302 is further arranged to adjust signal gain (e.g., via PGA block 314) such that the full dynamic range (FDR) of system 300 is utilized. Coarse adjustment circuit 302 is responsive to a coarse adjustment control signal (DAC_control) at node N326.

According to one embodiment, coarse adjustment circuit 302 is arranged to operate as follows. Coarse DAC block 312 is arranged to convert signal DAC_control into an analog signal that is provided at node N342. Summer block 310 is configured to provide a signal at node N340 in response to signal IN and the signal at node N342. Summer circuit 310 is arranged to provide the signal at node N340 such that the voltage at node N340 corresponds to the sum of the voltages at node N330 and N342. PGA block 314 is configured to amplify or attenuate the signal at node N340 to provide signal A_in at node N320.

Operation of Overranging ADC

Overranging ADC 306 is arranged to convert A_in into an intermediary digital signal (D_out), where D_out is provided at node N322. Overranging ADC 306 may be implemented by a variety of different architectures, including a pipeline analog-to-digital conversion architecture, and a flash analog-to-digital conversion architecture. The output range of overranging ADC 306 extends beyond the full dynamic range (FDR) of system 300.

Figure 4:
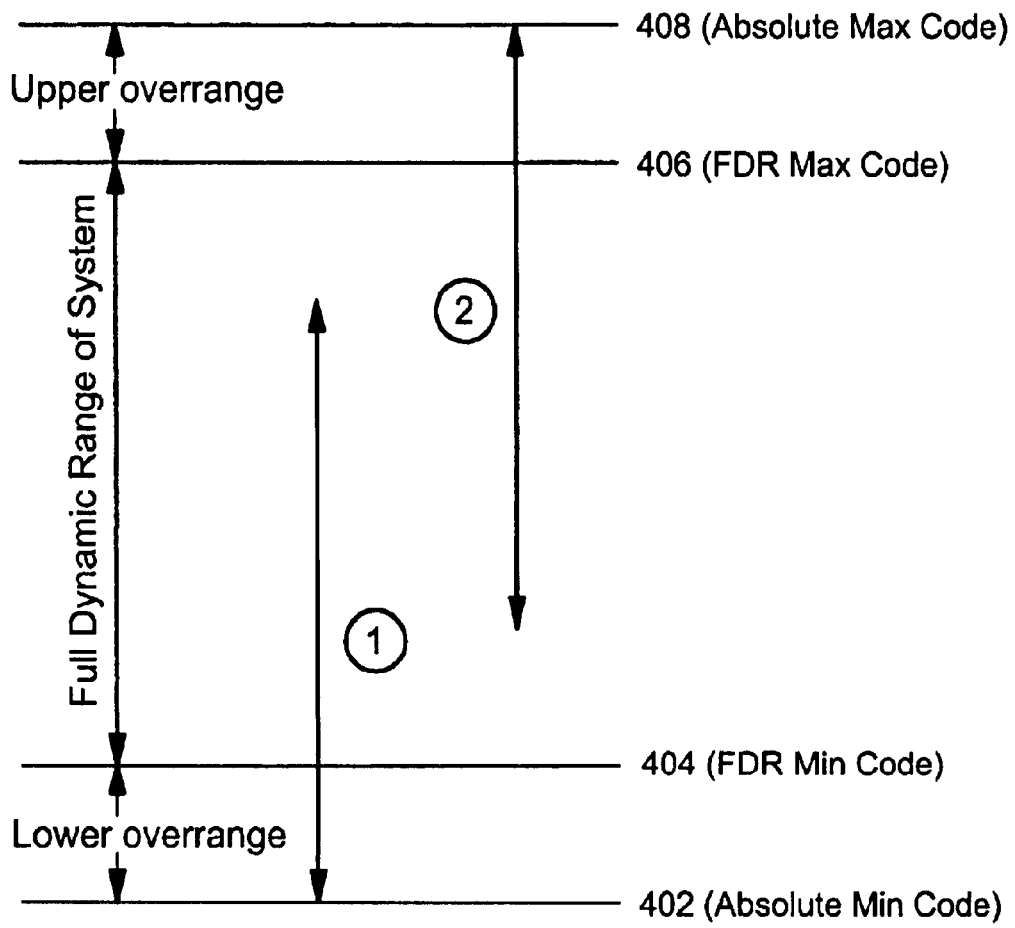
FIG. 4 is a graphic illustration for an output range of an example embodiment of an overranging ADC in an ADC system that is arranged in accordance with aspects of the present invention.

FIG. 4 is a graphic illustration for an output range of an example embodiment of an overranging ADC that is arranged in accordance with aspects of the present invention.

The full dynamic range (FDR) of system 300 extends from a first digital level (404) to a second digital level (406). Digital level 404 corresponds to a lower bound analog input voltage (e.g., $V_{NEG}$). Digital level 406 corresponds to an upper bound analog input voltage (e.g., $V_{POS}$). The output range of overranging ADC 306 extends from a third digital level (402) to a fourth digital level (408). Digital level 402 corresponds to a system lower bound analog input voltage (e.g. $V_{LO}$). Digital level 408 corresponds to a system upper bound analog input voltage (e.g. $V_{HI}$), where level 402 is less than level 404 relative to level 406, and level 408 is greater than level 406 relative to level 402. The output range of overranging ADC 306 includes the full dynamic range (FDR), a lower overrange from 402 to 404, and an upper overrange from 406 to 408. Part of signal D_out will be included in the lower overrange, when the system offset is negative as illustrated by range 1. Part of signal D_out will be included in the upper overrange when the system offset is positive as illustrated by range 2.

Figure 5:
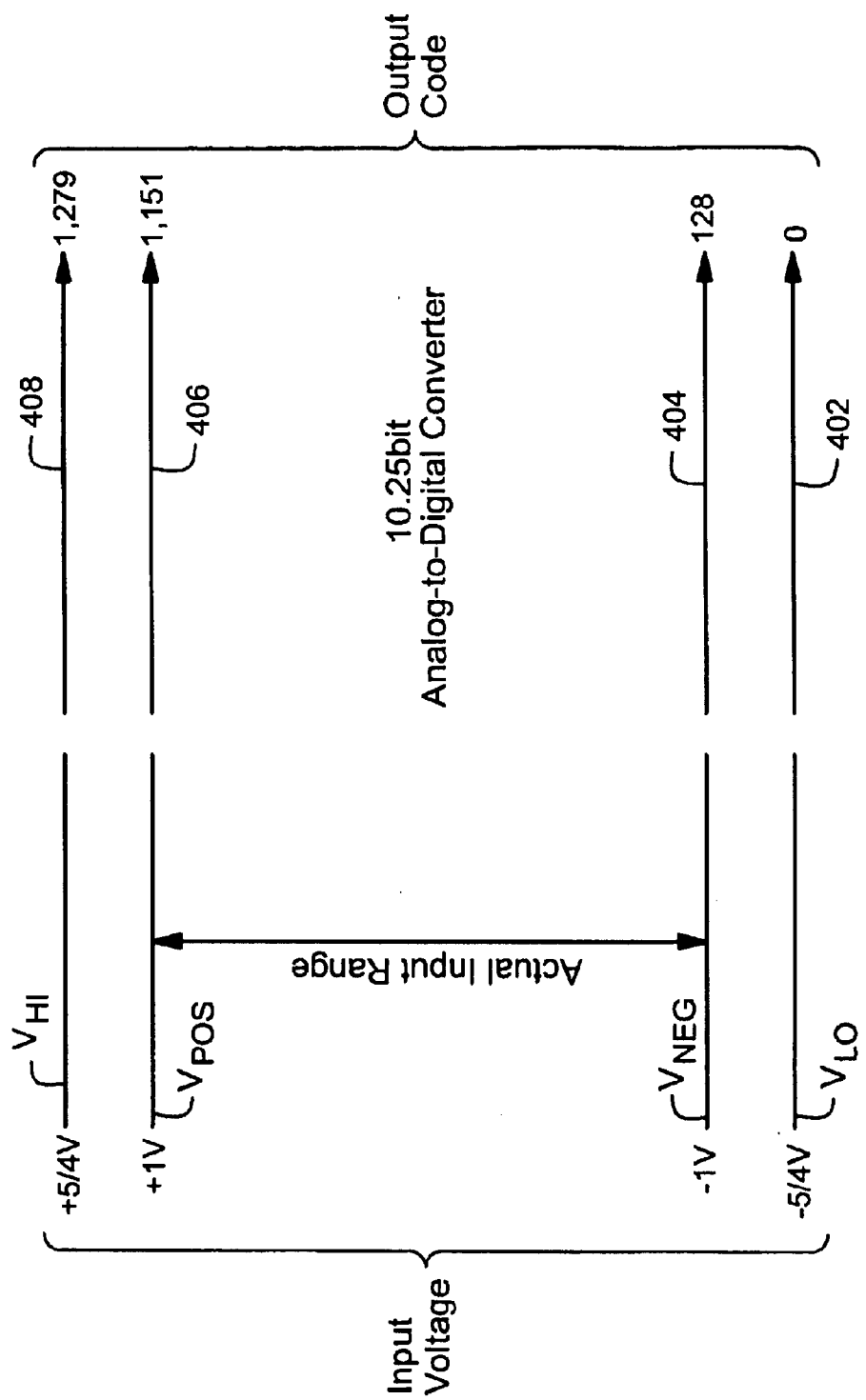
FIG. 5 is a graphic illustration for an output range for another example embodiment of an overranging ADC in an ADC system that is arranged in accordance with aspects of the present invention.

FIG. 5 is a graphic illustration for an output range for another example embodiment of an overranging ADC that is arranged in accordance with aspects of the present invention. According to the example illustrated in FIG. 5, $V_{LO}$ corresponds to −5/4 V, $V_{NEG}$ corresponds to −1V, $V_{POS}$ corresponds to 1V, and $V_{HI}$ corresponds to 5/4 V, and the full dynamic range (FDR) of system 300 corresponds to 10 bits. The conversion range of overranging ADC 306 corresponds to 10.25 bits, where the overrange on each side is 1/8 of the full dynamic range (FDR). The 10-bit output range of system 300 extends from a digital code of 0 at level 404 to a digital code of 1023 ($2^{10-1}$) at level 406. The 10.25-bit conversion range of overranging ADC 306 extends from a digital code of 0 at level 402 to a digital code of 1279 ($2^{10}+2*2^{7}-1$) at level 408. For this example, an input voltage of $V_{NEG}$ results in a digital output code of 128, while an input voltage of $V_{POS}$ results in a digital output code of 1151. Although FIG. 5 illustrates specific values (ranges and output codes), in any other embodiments are considered within the scope of the present invention.

Operation of Digital Control Block

Coarse offset calibration circuit 304 includes feedback logic for adjusting coarse DAC block 312. Coarse offset calibration circuit 304 is arranged to provide signal DAC_control at node N326 in response to signal D_out.

Signal D_out corresponds to a conversion code that is associated with the sum of the reference signal and the system offset during a calibration phase. Digital fine offset adjustment circuit 308 is configured to store a value (the fine offset) that is associated with signal D_out, during the calibration phase.

Digital fine offset adjustment circuit 308 is further configured to digitally subtract the fine offset from signal D_out. Digital fine offset adjustment circuit 308 is further configured to decode signal D_out such that signal ADC_OUT corresponds to the correct digital code corresponding to the full dynamic range. For the example shown in FIG. 5, signal D_out is decoded such that $V_{NEG}$ corresponds to a digital code of 0 rather than 128, and $V_{POS}$ corresponds to a digital code of 1023 rather than 1151.

Overranging ADC Examples

Overranging ADC 306 may be implemented via pipeline analog-to-digital conversion, flash analog-to-digital-conversion, or other methods of analog-to-digital conversion.

Figure 6:
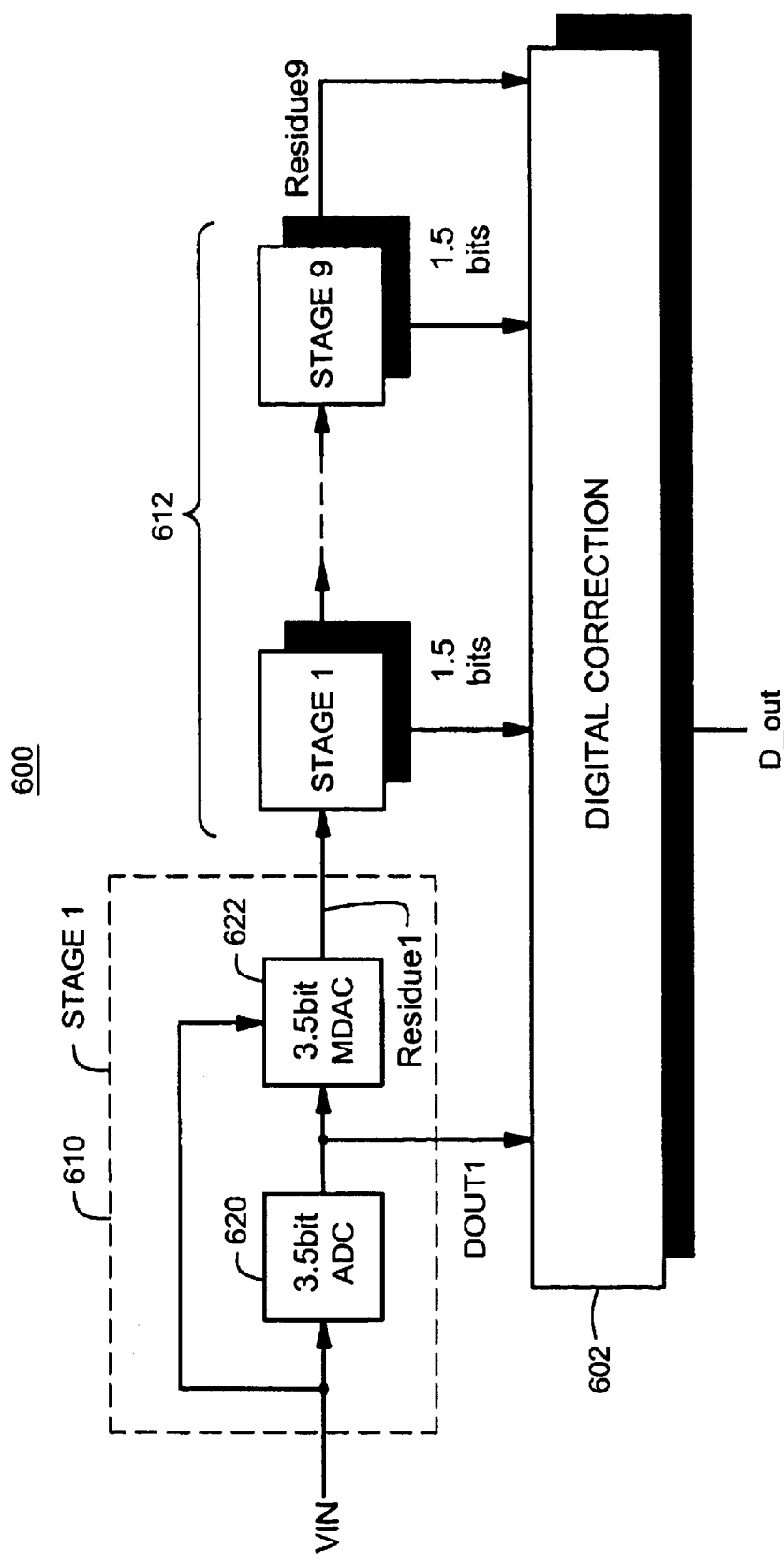
FIG. 6 is an illustration of an example embodiment of an overranging ADC that is arranged for operation in the ADC system of FIG. 3.

FIG. 6 is an illustration an example embodiment of an overranging ADC (600) that is arranged for operation in the ADC system of FIG. 3. Overranging ADC 600 includes stage 1 (610), a plurality of subsequent stages (612), and a digital correction circuit (602). According to one example, overranging ADC 600 is a 10.25 bit overranging ADC, where stage 1 (610) is a 3.5 bit stage and each of the subsequent stages (612) is a 1.5 bit stage. According to this example, stage 1 includes a 3.5 bit flash ADC (620) and a 3.5 bit MDAC (622).

Stage 1 provides a digital signal (DOUT1) and a residue signal (Residue1) in response to an intermediate analog signal (VIN). Each of the subsequent stages (612) provides another digital signal in response to the residue signal from the previous phase. Digital correction circuit 602 provides a digital intermediary digital signal (D_out) in response to the digital signal from each of the stages (610 and 612) and the residue signal (Residue9) of the last stage.

Figure 7:
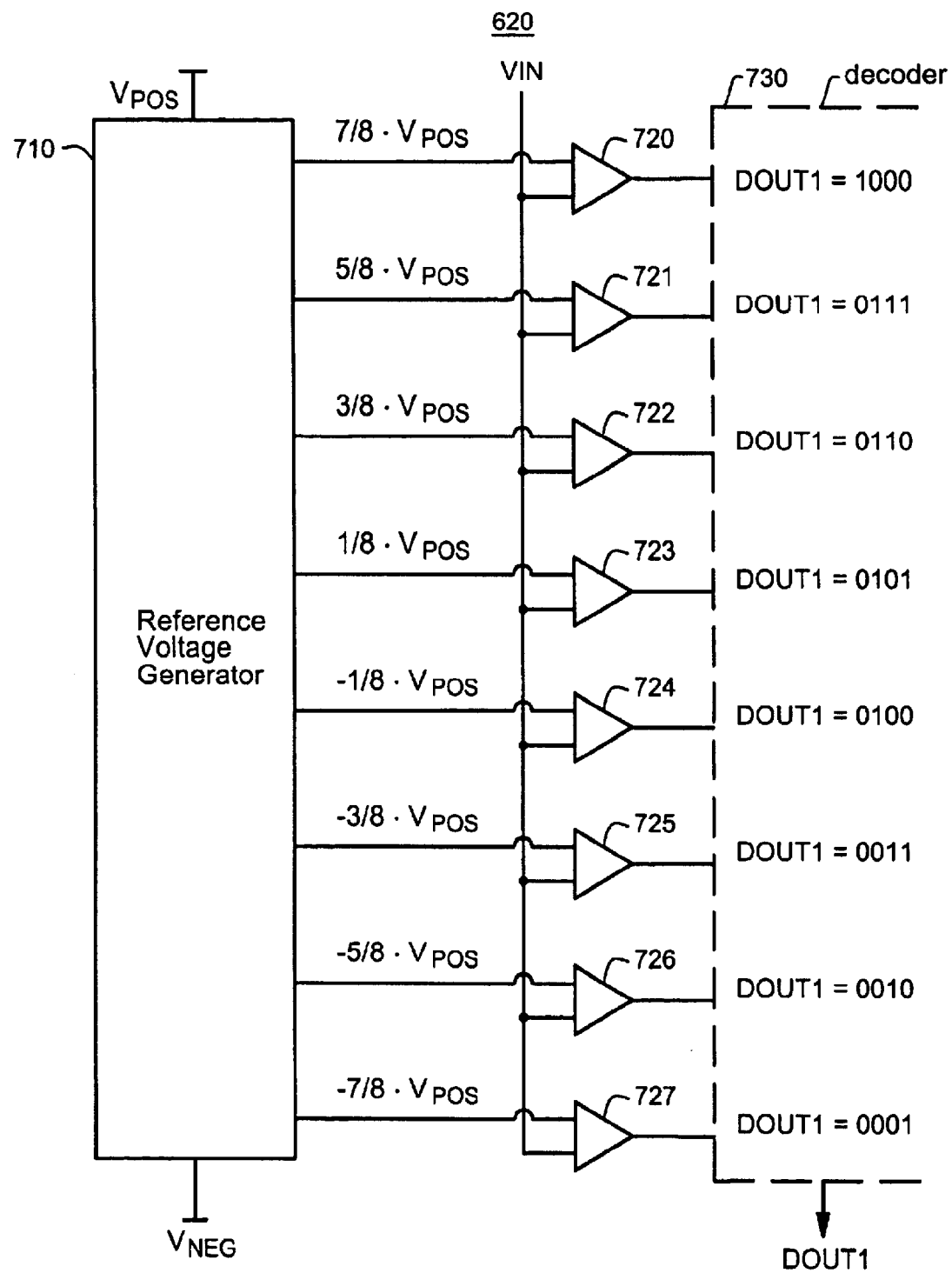
FIG. 7 is an illustration of an example embodiment of a 3.5 bit ADC that is arranged for operation in the ADC system of FIG. 3.

FIG. 7 is an illustration of an example embodiment of a 3.5 bit ADC (620) that is arranged for operation in the ADC system. ADC 620 includes a reference voltage generator circuit (710), eight comparators (720–727), and a decoder block (730). Reference voltage generator circuit 710 is configured to provide eight reference voltages. According to one example, the eight reference, voltages correspond to $7/8*V_{POS}$, $5/8*V_{POS}$, $3/8*V_{POS}$, $1/8*V_{POS}$, $-1/8*V_{POS}$, $-3/8*V_{POS}$, $-5/8*V_{POS}$, and $-7/8*V_{POS}$. The comparators (720–727) are configured to compare signal VIN to each of the eight reference voltages. The eight reference voltages provide 9 voltage ranges. Decoder block 730 is configured to provide signal DOUT1 in response outputs of the comparators (720–727). Signal DOUT1 has a four-bit code that corresponds to the voltage range that signal VIN is within. Example digital codes and their associated voltage ranges are illustrated in FIG. 9.

Figure 8A:
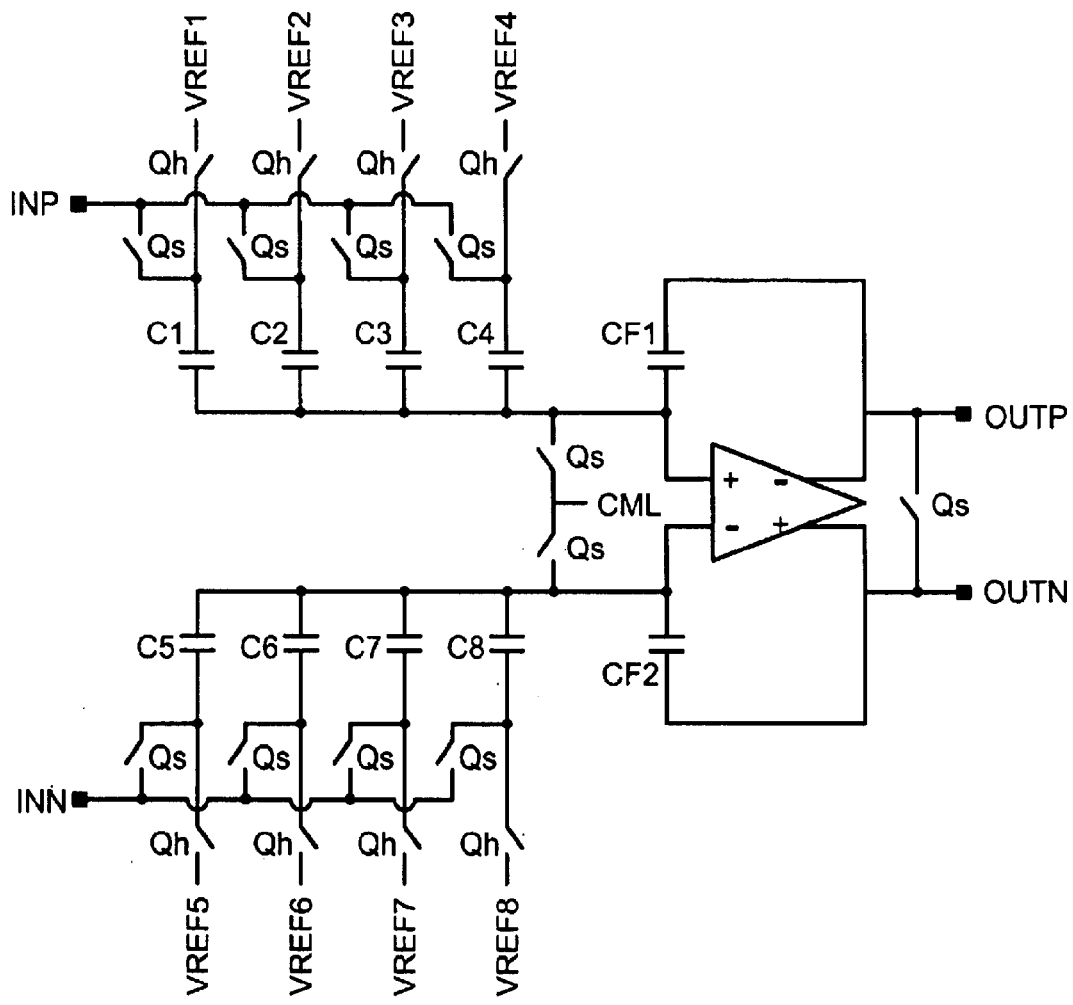
FIG. 8A is an illustration of an example embodiment of a multiplying digital-to-analog converter (MDAC) that is configured for operation in the ADC system of FIG. 3.

FIG. 8A is an illustration of an example embodiment of an MDAC (622) that is configured for operation in the ADC system of FIG. 3. MDAC 622 is a fully differential implementation. MDAC 622 includes eight sampling capacitors (C1–C8) (four on each signal path) and two feedback capacitors (CF1 and CF2) (one for each feedback path) that are arranged to operate with a fully differential operational transconductance amplifier such that a 3.5-bit conversion resolution is achieved.

Figure 8B:
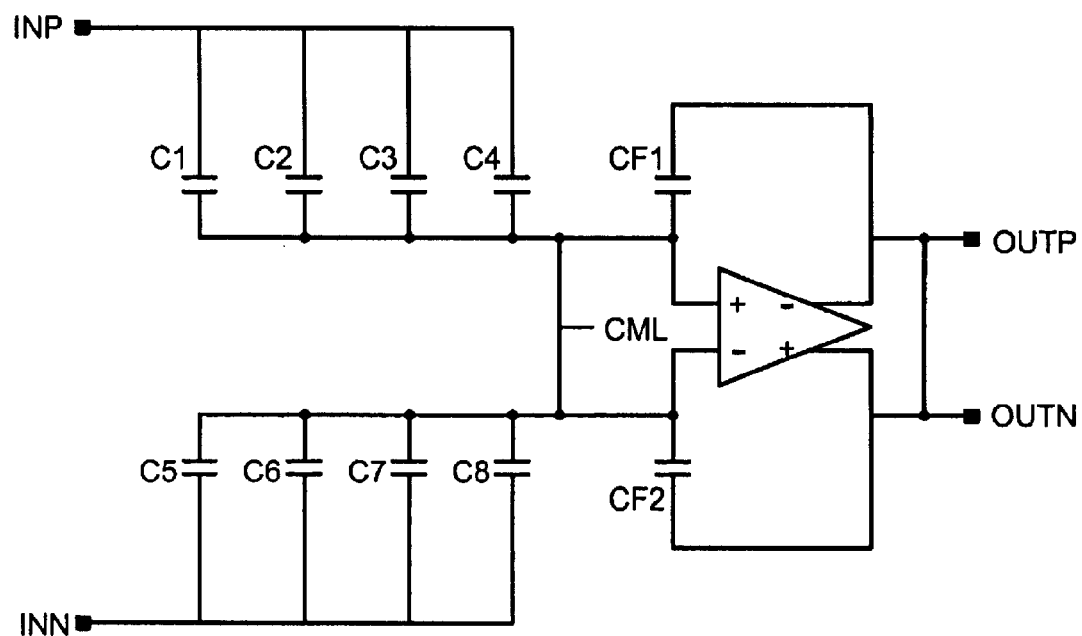
FIG. 8B is an illustration of an example embodiment of the MDAC of FIG. 8A during a sampling phase.

FIG. 8B is an illustration the example embodiment of MDAC 622 of FIG. 8A during a sampling phase (Qs). The intermediate analog signal (VIN=INP-INN) is sampled on the sampling capacitors (C1–C8) during the sampling phase ($Q_s$). The top plate of each of the capacitors is coupled to a common mode level (CML). The bottom plate of each of the capacitors C1–C4 is coupled to signal INP, and the bottom place of each of the capacitors C5–C8 is coupled to signal INN. The feedback capacitors (CF1, CF2) are discharged. ADC 620 is configured to convert the intermediate analog signal (INP-INN) to a corresponding digital code at the end of the sampling phase ($Q_s$).

Figure 8C:
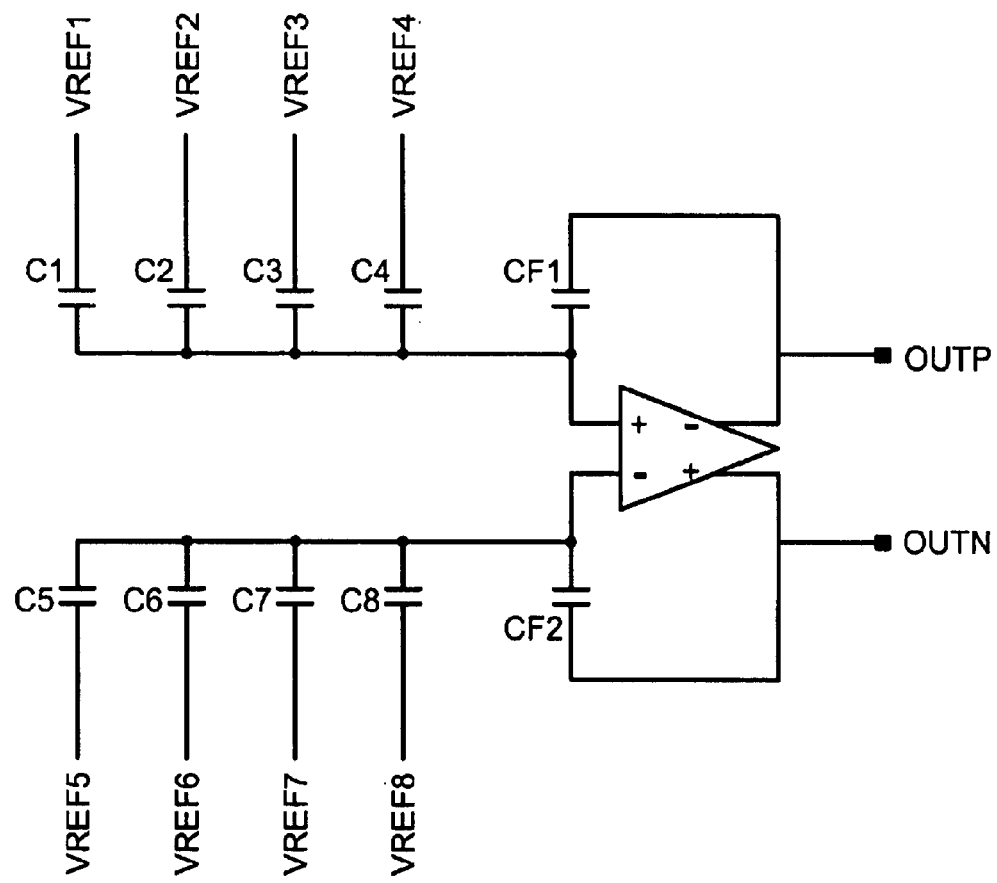
FIG. 8C is an illustration of an example embodiment of the MDAC of FIG. 8A during a holding phase.

FIG. 8C is an illustration of the example embodiment of MDAC 622 of FIG. 8A during a holding phase ($Q_h$), During the holding phase ($Q_h$), MDAC 622 is arranged in a negative feedback configuration. MDAC 622 is arranged such that charges sampled on the sampling capacitors (C1–C8) are transferred to the feedback capacitors (CF1, CF2) during the holding phase. ($Q_h$). The residue voltage (Residue1=OUTP-OUTN) is scaled by the capacitance ratios. For example, MDAC 622 is configured to amplify the intermediate analog signal (INP-INN) by a transfer gain of four when each of the capacitors (C1–C8, CF1–CF2) has approximately the same capacitance rating. The gain factor may be adjusting by adjusting the capacitance of the capacitors (C1–C8, CF1–CF2).

The bottom plate of each of the sampling capacitors (C1–C8) is coupled to receive a reference voltage (VREF1–VREF8 respectively). Digital correction circuit 602 (see. FIG. 6) is configured to adjust the reference voltages (VREF1–VREF8) in response to signal DOUT1. The reference voltages (VREF1–VREF8) are determined by signal DOUT1. Example reference voltages are illustrated by FIG. 9.

FIG. 9 is a tabular illustration of values of reference voltages that are utilized by the example embodiment of an MDAC (622) of FIG. 8A. The value of each of the reference voltages (VREF1–VREF8) depends on the digital code (DOUT1). The reference voltages (VREF1–VREF8) for each digital code are selected such that residue voltage (OUTP-OUTN) is shifted by an appropriate amount to prevent saturation in the conversion process. Shifting the residue voltage makes it possible to convert an input voltage that is in the lower or upper overrange. For this example, VREF1 through VREF4 are $-0.5*V_{POS}$ and VREF5 through VREF8 are $0.5*V_{POS}$. Accordingly, the residue voltage ($V_{OUT}$) corresponds to $4VIN+4*V_{POS}$.

By shifting the residue into the FDR, the pipeline converter (600) can successfully convert input signals that are normally outside of the full-scale conversion range. Digital correction algorithms can be employed to correct the intermediate digital code (D_out).

Figure 10:
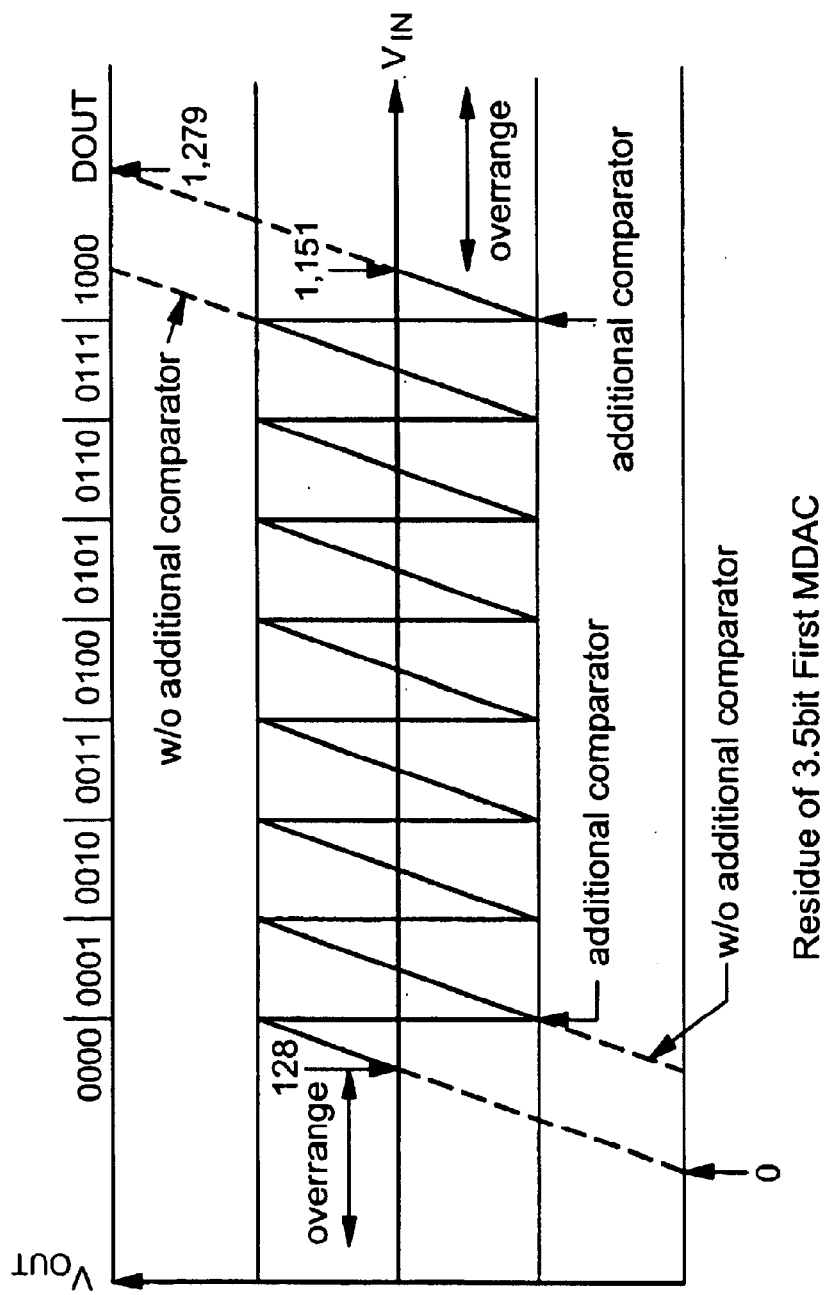
FIG. 10 is a graphical illustration of a residue curve for an example embodiment of an MDAC that is configured for operation in the ADC system of FIG. 3.

FIG. 10 is a graphical illustration of a residue curve for an example embodiment of an MDAC (622) that is configured for operation in the ADC system of FIG. 3. The codes from 0 to 128 correspond to the lower overrange, the codes from 128 to 1151 correspond to the FDR, and the codes from 1151 to 1279 correspond to the upper overrange. The portion of the residue curve that occurs in the lower and upper overranges is indicated with dotted lines in FIG. 10.

Many alternative embodiments of overranging ADC 306 are within the scope of the invention. For example, the first stage may be a 2.5-bit stage, or some other number of bits. Also, other means may be used to provide the overrange. For example, a reference extending circuit may be used to extend the range of overranging ADC 306 with a wider reference signal to include lower and upper overranges, as described with regard to FIG. 11 below.

Figure 11:
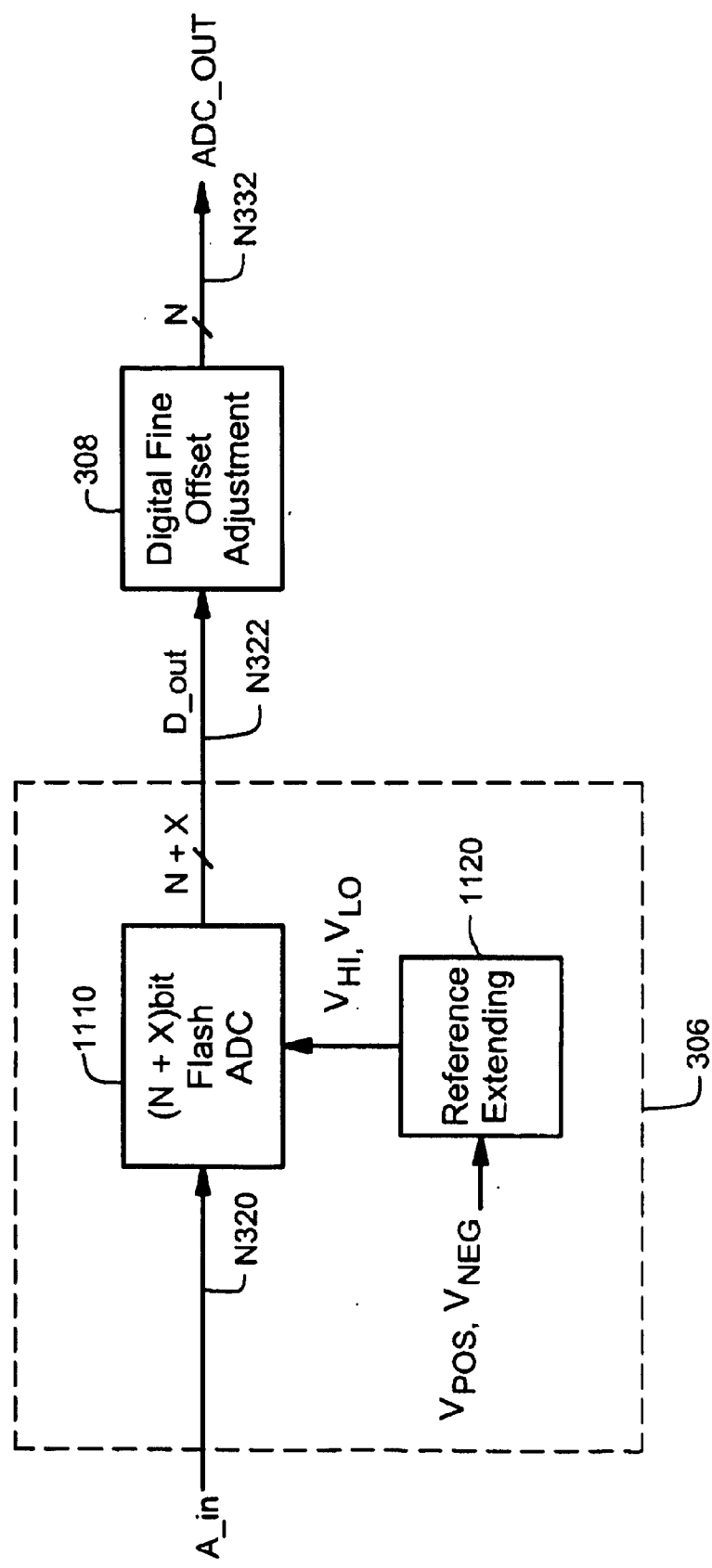
FIG. 11 illustrates another example embodiment of an overranging ADC that is arranged for operation the ADC system of FIG. 3.

FIG. 11 illustrates another example embodiment of an overranging ADC (306) that is arranged for operation the ADC system (300) of FIG. 3. The example embodiment of overranging ADC 306 that is illustrated in FIG. 11 includes a flash-type ADC (1110) and a reference extending circuit (1120). Reference extending circuit 1120 is configured to provide local reference signals ($V_{HI}$ and $V_{LO}$) in response to the first reference signal ($V_{NEG}$) and the second reference signal ($V_{POS}$) Signal $V_{HI}$ has a voltage that is greater than $V_{POS}$, and signal $V_{LO}$ has a voltage that is less than $V_{NEG}$. $V_{HI}$ and $V_{LO}$ are provided as reference signal to the flash-type ADC (1110) such that the dynamic range of the flash-type ADC (1100) is extended beyond the normal reference range (i.e., $V_{POS}$ and $V_{NEG}$).

Digital fine offset adjustment circuit 308 is configured to provide signal ADC_out with N bits of resolution. Flash ADC 1110 has a conversion range from $V_{LO}$ to $V_{HI}$. Flash ADC 1110 is configured to convert signal A_in to signal Dout with N+X bits of resolution, where X is greater than 0. X corresponds to the additional resolution bits that are associated with the overranging operation of the flash-type ADC (1110).

The above specification, examples and data provide a complete description of the manufacture and use of the composition of the invention since many embodiments of the invention can be made without departing from the spirit and scope of the invention, the invention resides in the claims hereinafter appended.

What is claimed is:

1. An analog-to-digital converter system that is configured to provide a digital output signal in response to an analog input signal, the system comprising:

an overranging analog-to-digital converter that is arranged to convert an intermediary analog signal into an intermediary digital signal, wherein: the intermediary analog signal is related to the analog input signal, an output range associated with the overranging analog-to-digital converter extends beyond a full dynamic range of the analog-to-digital converter system, the intermediary digital signal has a first number of bits of resolution; and a digital fine offset adjustment circuit that is configured to determine a fine offset during a calibration phase, and further configured to process the intermediary digital signal during a conversion phase such that: the determined fine offset is digitally subtracted from the intermediary digital signal to provide an offset adjusted digital signal, and the offset adjusted digital signal is decoded to provide the digital output signal such that the digital output signal has a second number of bits of resolution, wherein the first number of bits of resolution is greater than the second number of bits of resolution.

2. The analog-to-digital converter system of claim 1 further comprising:
   a coarse offset calibration circuit that is configured to adjust a course calibration control signal in response to the intermediary digital signal during the calibration phase; and
   a coarse correction circuit that is arranged to perform coarse correction on the analog input signal to provide the intermediary analog signal, wherein the coarse correction circuit is responsive to the coarse calibration control signal.

3. The analog-to-digital converter system of claim 2, wherein the coarse correction circuit is configured to provide coarse offset adjustment and the digital fine offset adjustment circuit is configured to provide fine offset calibration such that the digital output signal has approximately no offset.

4. The analog-to-digital converter system of claim 2, wherein the coarse correction circuit comprises:
   a coarse digital-to-analog converter block that is configured to convert the coarse calibration control signal into a coarse analog signal;
   a summer block that is configured to produce a sum signal in response to the analog input signal and the coarse analog signal, wherein the sum signal corresponds to a sum of the analog input signal and the coarse analog signal such that the sum signal corresponds to an offset corrected version of the analog input signal; and
   a programmable gain amplifier block that is arranged to scale the sum signal according to a gain factor to provide the intermediary analog signal, wherein the gain factor is selected such that a voltage range of the intermediary analog signal approximately corresponds to the full dynamic range.

5. The analog-to-digital converter system of claim 1, wherein the overranging analog-to-digital converter corresponds to at least one of a flash-type analog-to-digital converter and a pipeline-type analog-to-digital converter.

6. The analog-to-digital converter system of claim 1, wherein the output range of the overranging analog-to-digital converter includes the full dynamic range, a lower overrange, and an upper overrange.

7. The analog-to-digital converter system of claim 6, wherein the analog-to-digital converter system is configured for operation from a first reference signal and a second reference signal, wherein the full dynamic range consists of digital codes that are associated with a range of voltages from a first voltage associated with the first reference signal to a second voltage associated with the second reference signal, the lower overrange consists of digital codes that are associated with voltages that are below the second voltage, and the upper overrange consists of digital codes that are associated with voltages that are above the first voltage.

8. The analog-to-digital converter system of claim 7, wherein: the first number of bits of resolution corresponds to 10.25, the second number of bits of resolution corresponds to 10, the overranging analog-to-digital converter corresponds to a 10.25 bit pipeline overranging analog-to-digital converter, the first voltage corresponds to approximately 1 volt, and the second voltage corresponds to approximately −1 volt.

9. The analog-to-digital converter system of claim 7, wherein the overranging analog-to-digital converter comprises: a reference extending circuit and a flash-type converter circuit, wherein the reference extending circuit configured to provide a first local reference signal and a second local reference signal from the first reference signal and the second reference signal, wherein a third voltage associated with the first local reference signal is greater than the first voltage, a fourth voltage associated with the second local reference signal is less than the first voltage, and wherein the flash-type converter circuit is operated from the first local reference signal and the second local reference signal such that the flash-type converter circuit has a dynamic range that extends beyond the first voltage and the second voltage.

10. The analog-to-digital converter system of claim 1, wherein the overranging analog-to-digital converter comprises: a digital correction circuit, a first pipeline stage converter, and a second pipeline stage converter, wherein the first pipeline stage converter includes a flash-type analog-to-digital converter and a multiplying-type analog-to-digital converter, wherein the flash-type analog-to-digital converter is configured to identify one of a plurality of voltages ranges that is associated with the intermediate analog voltage, wherein the multiplying-type analog-to-digital converter is configured to provide a residue signal that is shifted by a DC level, wherein the DC level is selected according to the identified voltage range, and wherein the residue signal is provided as an input to the second pipeline stage converter.

11. A method of providing a digital output signal in response to an analog input signal, the method comprising:
   converting an intermediary analog signal into an intermediary digital signal, wherein the intermediary analog signal is related to the analog input signal, a dynamic range associated with the intermediary digital signal extends beyond a full dynamic range associated with the digital output signal, the intermediary digital signal has a first number of bits of resolution, the digital output signal has a second number of bits of resolution, and wherein the first number of bits of resolution is greater than the second number of bits of resolution;
   determining a fine offset in response to the intermediate digital signal during a calibration phase; and
   digitally subtracting the fine offset from the intermediary digital signal to provide an offset adjusted digital signal, wherein the offset adjusted digital signal corresponds to an offset adjusted version of the intermediate digital signal.

12. The method of claim 11, further comprising decoding the offset adjusted digital signal to provide the digital output signal, wherein the digital output signal is within the full dynamic range.

13. The method of claim 11, the method further comprising:
   performing coarse correction on the analog input signal in response to a coarse calibration control signal to provide the intermediate analog signal; and
   providing the coarse calibration control signal in response to the intermediary digital signal;
   wherein performing coarse correction comprises:
      converting the coarse calibration control signal into a coarse analog signal;
      producing a sum signal in response to the analog input signal and the coarse analog signal, wherein the sum signal corresponds to a sum of the analog input signal and the coarse analog signal such that the sum signal corresponds to an offset corrected version of the analog input signal; and scaling the sum signal according to a gain factor to provide the intermediary analog signal, wherein the gain factor is selected such that a voltage range of the intermediary analog signal approximately corresponds to the full dynamic range.

14. The method of claim 11, wherein the output range of the intermediate digital signal includes a lower overrange and an upper overrange.

15. A analog-to-digital converter system that is configured to provide a digital output signal in response to an analog input signal, the system comprising:
   a first means for converting that is arranged to convert an intermediary analog signal into an intermediary digital signal, wherein the intermediary analog signal is related to the analog input signal, an output range of the means for converting extends beyond a full dynamic range of the analog-to-digital converter system, the intermediary digital signal has a first number of bits of resolution, the digital output signal has a second number of bits of resolution, and wherein the first number of bits of resolution is greater than the second number of bits of resolution;
   a means for determining that is configured to determine a fine offset in response to the intermediate digital signal during a calibration phase; and
   a means for subtraction that is configured to digitally subtract the fine offset from the intermediary digital signal to provide an offset adjusted digital signal, wherein the offset adjusted digital signal corresponds to an offset adjusted version of the intermediate digital signal.

16. The analog-to-digital converter system of claim 15, further comprising:
   a means for correcting that is arranged to perform coarse correction on the analog input signal to provide the intermediary analog signal, wherein the means for correcting is responsive to a coarse calibration control signal; and
   a second means for providing that is configured to provide the coarse calibration control signal in response the intermediate digital signal;

wherein the means for correcting comprises:
   a second means for converting that is configured to convert the coarse calibration control signal into a coarse analog signal;
   a means for summing that is configured to produce a sum signal in response to the analog input signal and the coarse analog signal, wherein the sum signal corresponds to a sum of the analog input signal and the coarse analog signal such that the sum signal corresponds to an offset corrected version of the analog input signal; and
   a means for scaling that is configured to scale the sum signal according to a gain factor to provide the intermediary analog signal, wherein the gain factor is selected such that a voltage range of the intermediary analog signal approximately corresponds to the full dynamic range.

17. The analog-to-digital converter system of claim 15, further comprising a means for decode that is configured to decode the offset adjusted digital signal to provide the digital output signal, wherein the digital output signal is within the full dynamic range.

18. The analog-to-digital converter system of claim 15, wherein the first means for converting comprises one of a flash-type analog-to-digital converter and pipeline-type analog-to-digital converter.

19. The analog-to-digital converter system of claim 15, wherein the output range of the overranging analog-to-digital converter includes the full dynamic range, a lower overrange, and an upper overrange, the analog-to-digital converter system is con figured for operation from a first reference signal and a second reference signal, wherein the full dynamic range consists of digital codes that are associated with a range of voltages from a first voltage associated with the first reference signal to a second voltage associated with the second reference signal, the lower overrange consists of digital codes that are associated with voltages that are below the second voltage, and the upper overrange consists of digital codes that are associated with voltages that are above the first voltage.

* * * * *

UNITED STATES PATENT AND TRADEMARK OFFICE
CERTIFICATE OF CORRECTION

PATENT NO.   : 6,791,484 B1
DATED        : September 14, 2004
INVENTOR(S)  : Bumha Lee et al.

It is certified that error appears in the above-identified patent and that said Letters Patent is hereby corrected as shown below:

Column 2,
Line 18, delete "EMBODIMENTS" and insert -- EMBODIMENT --.
Line 59, after "overrange" delete ",".

Column 4,
Line 7, delete "$2^{10-1}$" and insert -- $2^{10}$-1 --.
Line 14, delete "in any" and insert -- many --.
Line 25, after "D_out" delete ",".
Line 65, after "reference" delete ",".
Lines 38-39, delete "analog-to-digital-conversion" and insert -- analog-to-digital conversion --.

Column 5,
Line 31, delete "($Q_h$)," and insert -- ($Q_h$). --.
Line 47, after "see" delete ".".

Column 6,
Line 31, delete "1100" and insert -- 1110 --.
Line 43, delete "since" and insert -- Since --.

Column 7,
Line 8, delete "course" and insert -- coarse --.

Column 9,
Line 41, after "response" insert -- to --.

UNITED STATES PATENT AND TRADEMARK OFFICE
CERTIFICATE OF CORRECTION

PATENT NO. : 6,791,484 B1
DATED : September, 14, 2004
INVENTOR(S) : Bumha Lee et al.

It is certified that error appears in the above-identified patent and that said Letters Patent is hereby corrected as shown below:

Column 10,
Line 31, delete "con figured" and insert -- configured --.

Signed and Sealed this

Fifth Day of April, 2005

JON W. DUDAS
*Director of the United States Patent and Trademark Office*